United States Patent
Sano

(10) Patent No.: US 9,866,361 B2
(45) Date of Patent: Jan. 9, 2018

(54) RADIO COMMUNICATION DEVICE, OSCILLATION CIRCUIT, AND SENSITIVITY SUPPRESSION REDUCTION METHOD

(71) Applicant: JVC KENWOOD CORPORATION, Yokohama-shi, Kanagawa (JP)

(72) Inventor: Naoto Sano, Yokohama (JP)

(73) Assignee: JVC KENWOOD CORPORATION, Yokohama-Shi, Kanagawa (JP)

(*) Notice: Subject to any disclaimer, the term of this patent is extended or adjusted under 35 U.S.C. 154(b) by 0 days.

(21) Appl. No.: 15/379,270

(22) Filed: Dec. 14, 2016

(65) Prior Publication Data
US 2017/0214510 A1   Jul. 27, 2017

(30) Foreign Application Priority Data

Jan. 27, 2016   (JP) .................. 2016-012955

(51) Int. Cl.
| | | |
|---|---|---|
| *H04B 7/10* | (2017.01) | |
| *H04L 5/00* | (2006.01) | |
| *H03L 7/099* | (2006.01) | |
| *H03L 7/093* | (2006.01) | |

(52) U.S. Cl.
CPC ............ *H04L 5/0073* (2013.01); *H03L 7/093* (2013.01); *H03L 7/099* (2013.01); *H04L 5/0048* (2013.01)

(58) Field of Classification Search
CPC ....... H04L 1/06; H04L 27/2647; H04L 7/033; H03L 7/0891; H03L 7/085
USPC ............... 375/347, 294, 354, 373, 375, 376; 327/156, 157; 455/103, 127, 307
See application file for complete search history.

(56) References Cited

U.S. PATENT DOCUMENTS

| | | | | |
|---|---|---|---|---|
| 4,652,159 A * | 3/1987 | Nagai | ............... | B41J 19/202 318/607 |
| 8,803,627 B1 * | 8/2014 | Xu | ............... | H03B 5/1228 331/16 |
| 2002/0196881 A1 * | 12/2002 | Kalveram | ............... | H03J 7/065 375/354 |
| 2010/0315138 A1 * | 12/2010 | Namba | ............... | H03L 1/026 327/157 |
| 2011/0043289 A1 * | 2/2011 | Wan | ............... | H03L 7/081 331/25 |
| 2015/0303929 A1 * | 10/2015 | Hamdane | ............... | H03L 7/085 327/105 |

FOREIGN PATENT DOCUMENTS

JP        2011-14961 A       1/2011

* cited by examiner

*Primary Examiner* — Khai Tran
(74) *Attorney, Agent, or Firm* — Nath, Goldberg & Meyer; Jerald L. Meyer; Stanley N. Protigal

(57) ABSTRACT

A radio communication device includes an oscillation circuit and a modulation path. The oscillation circuit is configured to perform PLL control by using a reference frequency oscillated by a reference oscillator. The modulation path is configured to modulate a reference signal outputted from the reference oscillator, by a signal of a comparison frequency as a modulation wave.

6 Claims, 3 Drawing Sheets

… (1) …

RADIO COMMUNICATION DEVICE, OSCILLATION CIRCUIT, AND SENSITIVITY SUPPRESSION REDUCTION METHOD

CROSS REFERENCE TO RELATED APPLICATION

This application is based upon and claims the benefit of priority under 35 U.S.C. §119 from Japanese Patent Application No. 2016-012955 filed on Jan. 27, 2016, the entire contents of which are incorporated herein by reference.

BACKGROUND

The present disclosure relates to a radio communication device, an oscillation circuit, and a sensitivity suppression reduction method.

A radio communication device typically includes a receiving circuit and an oscillation circuit. The receiving circuit receives a signal wave transmitted from the outside via an antenna, frequency-converts a received RF (Radio Frequency) signal to an IF (Intermediate Frequency) signal, and demodulates the IF signal. The oscillation circuit outputs a local signal for frequency conversion.

The oscillation circuit includes a reference oscillator, and performs PLL (phase-locked loop) control by using a frequency in which the reference oscillator oscillates as a reference frequency. The reference oscillator outputs a reference signal of the reference frequency. The reference oscillator usually generates harmonics of the reference frequency when it oscillates at the reference frequency. The harmonics radiate to a receiving circuit, and interference with the RF signals of the harmonics is a factor causing suppression of the reception sensitivity.

Japanese Unexamined Patent Application Publication No. 2011-14961 (Patent Document 1) discloses that changing the reference frequency reduces the suppression of the reception sensitivity caused by interference of the harmonics.

SUMMARY

However, the radio communication device disclosed in Patent Document 1 needs a circuit for changing the reference frequency, and accordingly, the circuit configuration becomes more complex. Moreover, it is necessary to set whether or not to change the reference frequency in accordance with the reception frequency.

A first aspect of the embodiments provides a radio communication device including: an oscillation circuit configured to perform PLL control by using a reference frequency oscillated by a reference oscillator; and a modulation path configured to modulate a reference signal outputted from the reference oscillator by a signal of comparison frequency, as a modulation wave.

A second aspect of the embodiments provides an oscillation circuit including: a phase-locked loop configured to perform PLL control by using a reference frequency oscillated by a reference oscillator; a modulation path configured to modulate a reference signal outputted from the reference oscillator by a signal of a comparison frequency, as a modulation wave.

A third aspect of the embodiments provides a sensitivity suppression reduction method including: with a phase-locked loop, performing PLL control by using a reference frequency oscillated by a reference oscillator; and modulating a reference signal outputted from the reference oscillator by a signal of a comparison frequency, as a modulation wave.

DETAILED DESCRIPTION

First Embodiment

The radio communication device, the oscillation circuit, and the sensitivity suppression reduction method according to the first embodiment are described with reference to FIGS. 1-3.

Figure 1:
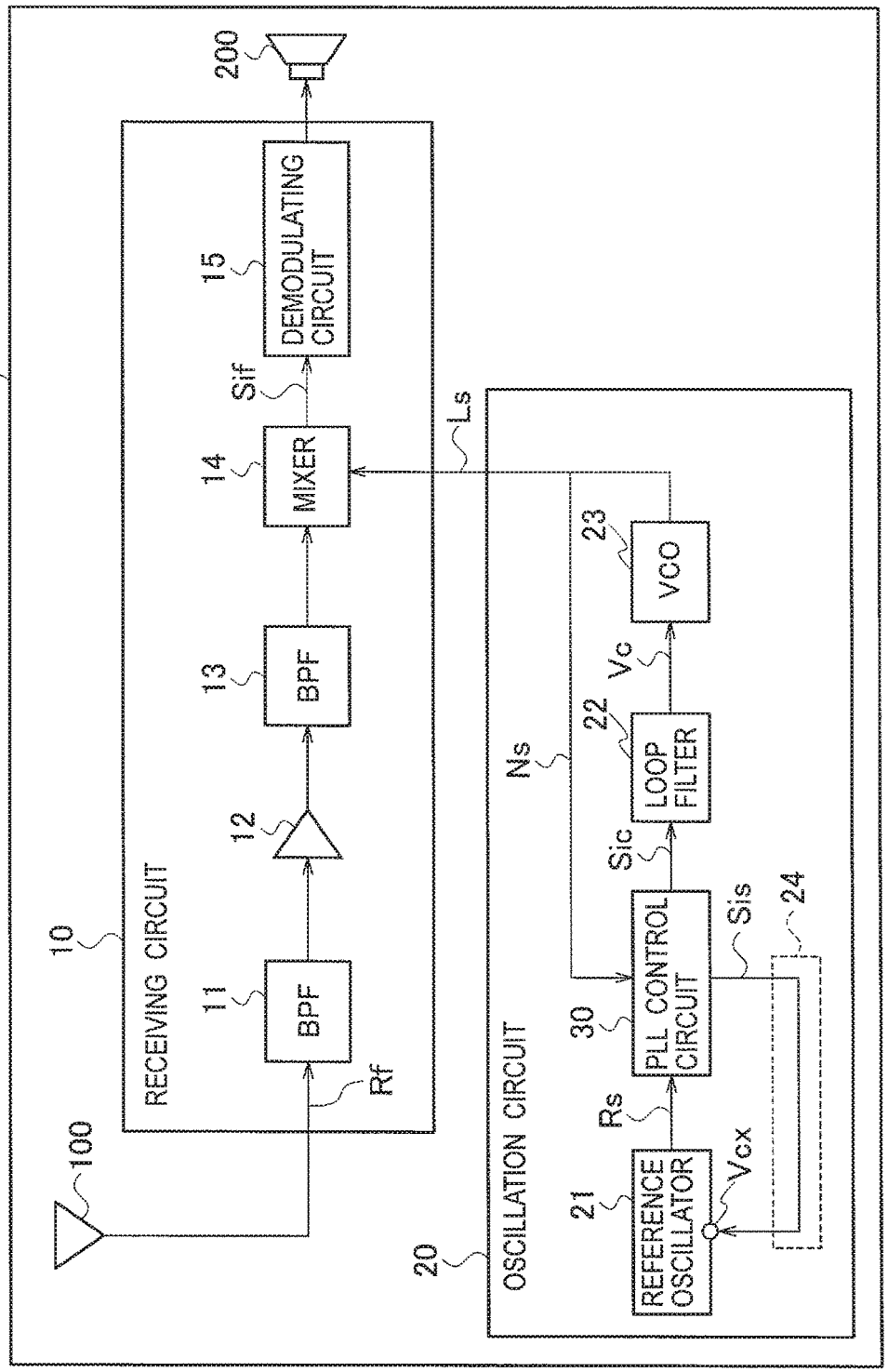
FIG. 1 is a block diagram illustrating a radio communication device according to the first embodiment.
Figure 2:
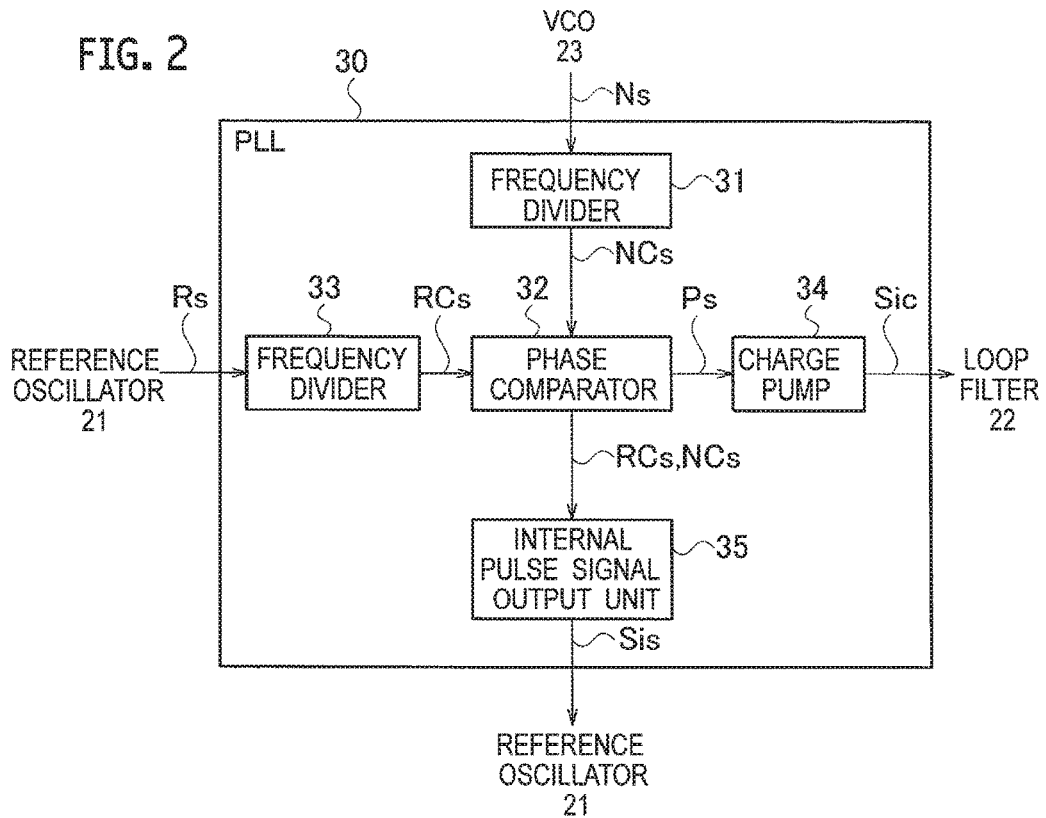
FIG. 2 is a block diagram illustrating a PLL control circuit in FIG. 1.

The radio communication device 1 shown in FIG. 1 includes a receiving circuit 10 and an oscillation circuit 20. The receiving circuit 10 and the oscillation circuit 20 may be composed of mounting boards. Moreover, the radio communication device 1 includes an antenna 100 for receiving a signal wave, and a notification unit 200 for notifying a demodulated signal.

In the radio communication device 1 of FIG. 1, the antenna 100 receives a signal wave transmitted from the outside as a received wave. The received wave has a frequency range of 768-860 MHz, for example. In order to facilitate understanding of the description, a description is given of a case where the frequency of the received wave is 768 MHz, and the antenna 100 receives a signal wave having a frequency of 768 MHz. Note that the frequency of the received wave is not limited to 768 MHz. The frequency bandwidth of the received wave by the radio communication device 1 is less than ±2.5 kHz and the modulation frequency is DC-3000 Hz, but the frequency bandwidth and the modulation frequency are not limited thereto.

The oscillation circuit 20 outputs a local signal Ls to the receiving circuit 10. The receiving circuit 10 mixes the received wave (RF signal Rf) received by the antenna 100 and the local signal Ls, converts the mixed signal into an IF signal Sif, demodulates the IF signal Sif, and outputs the demodulated signal to the notification unit 200. The frequency of the RF signal Rf is 768 MHz.

The receiving circuit 10 includes a bandpass filter (BPF) 11, an amplifier 12, a, bandpass filter (BPF) 13, a mixer 14, and a demodulating circuit 15.

The BPF 11 has a function to remove unnecessary frequency components from, the RF signal Rf. For example, the BPF 11 removes unnecessary frequency components other than the frequency range of 768-860 MHz from the RF signal Rf. The BPF 11 outputs the RF signal Rf, in which unnecessary frequency components are removed, to the amplifier 12.

The amplifier 12 amplifies the RF signal Rf, and outputs the amplified RF signal Rf to the BPF 13. The BPF 13 has a function to remove the harmonic's of the RF signal Rf which are generated by the amplifier 12. For example, the BPF 13 removes unnecessary frequency components other than the frequency range of 768-860 MHz from the RF signal Rf. The BPF 13 outputs the RF signal Rf to the mixer 14.

The BPFs 11 and 13 may have the same, or different filter characteristics. Note that the receiving circuit 10 may be configured to have only one of either the BPF 11 or the BPF 13.

The mixer 14 mixes the RF signal Rf outputted from the BPF 13 and the local signal Ls outputted from the oscillation circuit 20, and converts the mixed signal into the IF signal Sif.

The demodulating circuit 15 demodulates the IF signal Sif. For example, the demodulating circuit 15 frequency-demodulates the IF signal Sif, if the signal wave is frequency-modulated. The demodulating circuit 15 performs demodulation by the demodulation method corresponding to the modulation applied to the signal wave. The demodulating circuit 15 outputs the demodulated signal to the notification unit 200.

In the radio communication device 1, the notification unit 200 notifies the demodulated signal. The notification unit 200 is a speaker, for example, and when the demodulated signal is an audio signal, the notification unit 200 converts the demodulated signal into a notification sound.

The oscillation circuit 20 performs PLL control by using an oscillating frequency oscillated by a reference oscillator as a reference frequency, and PLL controls an oscillating frequency of a voltage-controlled oscillator (VCO). The oscillation circuit 20 includes a reference oscillator 21, a PLL control circuit 30, a loop filter 22, and a VCO 23. In addition, the oscillation circuit 20 includes a later-described modulation path 24. The modulation path 24 may be provided outside the oscillation circuit 20.

The PLL control circuit 30, a loop filter 22, and a VCO 23 constitute a PLL. The PLL control circuit 30 may be constituted by an integrated circuit.

The reference oscillator 21 generates a reference signal Rs of a reference frequency of 19.2 MHz, for example, and outputs the reference signal Rs to the PLL control circuit 30. The reference oscillator 21 is a Voltage-Controlled, Temperature-Compensated Crystal Oscillator (VC-TCXO), for example. The voltage control range of the reference oscillator 21 is ±25 ppm, for example, and the reference oscillator 21 includes a voltage control terminal Vcx for controlling the voltage.

The PLL control circuit 30 compares the reference signal Rs and a negative feedback signal Ns outputted from the VCO 23 in the loop, and outputs the comparison result. Specifically, the PLL control circuit 30 divides the frequency of the reference signal Rs and a negative feedback signal Ns, and compares the phases with each other. The PLL control circuit 30 generates a control current pulse signal Sic to make the phase difference constant based on the comparison result, and outputs the control current pulse signal Sic to the loop filter 22.

The PLL control circuit 30 outputs an internal pulse signal Sis of a comparison frequency based on the reference signal Rs or the negative feedback signal Ns to the reference oscillator 21 via the modulation path 24. The modulation path 21 is described later in detail.

The loop filter 22 removes unnecessary frequency components from the control current pulse signal Sic. The loop filter 22 converts the control current pulse signal Sic into a control voltage signal Vc, and outputs the control voltage signal Vc to the VCO 23.

The VCO 23 generates the local signal Ls of the frequency of 8.26.05 MHz, or example, and outputs the local signal Ls to the receiving circuit 10.

The mixer in the receiving circuit 10 mixes the RE signal Rf and the local signal Ls, and converts the mixed signal into the IF signal Sif of the intermediate frequency of 58.05 MHz.

The PLL control circuit 30 shown in FIG. 1 is specifically described with reference to FIG. 2. The PLL is a fractional frequency division. PLL (fractional-N PLL), for example, and the PLL control circuit 30 is a part of the fractional-N PLL. The PLL control circuit 30 includes a frequency divider 31, a phase comparator 32, a frequency divider 33, a charge pump 34, and an internal pulse signal output unit 35.

The frequency divider 31 divides the negative feedback signal Ns outputted from the VCO 23 in the loop by the dividing ratio of 1/N, and converts into a negative feedback comparison signal NCs of a comparison frequency fn. For example, if N=4130.25, the comparison frequency fn of the negative feedback comparison signal NCs is 200 kHz. The frequency divider 31 outputs the negative feedback comparison signal NCs to the phase comparator 32.

The frequency divider 33 divides the reference signal Rs outputted from the reference oscillator 21 by the division ratio of 1/R, and converts into a reference comparison signal RCs of a comparison frequency fr. For example, if R=96, the comparison frequency fr of the reference comparison signal RCs is 200 kHz. The frequency divider 33 outputs the reference comparison signal RCs to the phase comparator 32.

The phase comparator 32 compares the comparison frequency fr of the reference comparison signal RCs and the comparison frequency fn of the negative feedback comparison signal NCs, and generates a phase difference pulse signal Ps of a comparison frequency fp.

Specifically, the phase comparator 32 compares the comparison frequency fr of the reference comparison signal RCs and the comparison frequency fn of the negative feedback comparison signal NCs, and adjusts the duty ratio of the phase difference pulse signal Ps so as to be smaller when the comparison frequency fn is higher than the comparison frequency fr. Moreover, the phase comparator 32 adjusts the duty ratio of the phase difference pulse signal Ps so as to be greater when the comparison frequency fn is lower than the comparison frequency fr. The phase comparator 32 outputs the phase difference pulse signal Ps to the charge pump 34.

The charge pump 34 converts the phase difference pulse signal Ps into the control current pulse signal Sic, and outputs the control current pulse signal Sic to the loop filter 22.

The reference comparison signal RCs is inputted to the internal pulse signal output unit 35 from the phase comparator 32. Note that the reference comparison signal RCs may be inputted to the internal pulse signal output unit 35 from the frequency divider 33. The internal pulse signal output unit 35 outputs the reference comparison signal RCs to the reference oscillator 21 as the internal pulse signal Sis.

The negative feedback comparison signal NCs may be inputted to the internal pulse signal output unit 35 from the phase comparator 32 or the frequency divider 31. In this case, the internal pulse signal output unit 35 outputs the negative feedback comparison signal NCs to the reference oscillator 21 as the internal pulse signal Sis.

The oscillation circuit 20 includes a path for transmitting the internal pulse signal Sis from the internal pulse signal output unit 35 to the voltage control terminal Vox of the reference oscillator 21. This path is referred to as the modulation path 24. That is, the modulation path 24 modulates the reference signal Rs outputted from the reference oscillator 21 by a signal of the comparison frequency as a modulation wave.

The internal pulse signal Sis is a pulse signal of a rectangular wave, for example. The frequency of the internal pulse signal Sis is an N divider frequency of the PLL control circuit 30, that is, the frequency of the internal pulse signal Sis is the comparison frequency fr or fn. Note that FIG. 2 shows an example in which the phase comparator 32 provides the internal pulse signal output unit 35 with the reference comparison signal RCs and the negative feedback comparison signal NCs.

Figure 3:
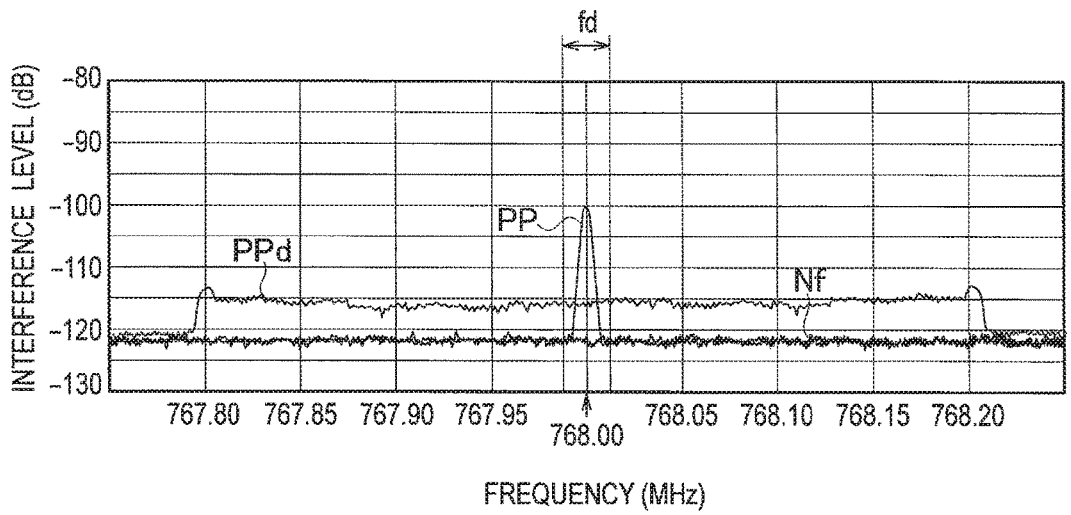
FIG. 3 is a frequency characteristic diagram for explaining the reduction of interference of the harmonics.

With reference to FIG. 3, a principle is described that the interference level of the harmonics is reduced. In FIG. 3, the vertical axis indicates the interference level (attenuation), and the horizontal axis indicates the frequency. In FIG. 3, the center line shows 768 MHz. In FIG. 3, fd is the frequency bandwidth when a signal wave of 768 MHz is received. The frequency bandwidth fd is ±2.5 kHz, for example. As described above, the reference signal Rs outputted from the reference oscillator 21 is modulated by the signal of the reference frequency as the modulation wave. As shown in FIG. 3, even when the harmonics of the reference frequency become an interference signal PP to the frequency bandwidth fd, the interference signal PP becomes a diffused interference signal PPd. Accordingly, the interference level in the frequency bandwidth of the received signal is reduced.

The details of the radio communication device 1 and the sensitivity suppression reduction method which reduce the sensitivity suppression based on the above-described principle, is described below.

Returning to FIG. 1, the receiving circuit 10 receives a received wave of the frequency 768 MHz via the antenna 100, for example. The reference oscillator 21 in the oscillation circuit 20 outputs the reference signal Rs of the reference frequency of 19.2 MHz, for example. Usually, when the reference oscillator 21 oscillates at the reference frequency, harmonics thereof are generated.

In this case, as shown in FIG. 3, forty times harmonics (768 MHz) that is forty times the reference frequency in the frequency bandwidth fd becomes an interference signal. In FIG. 3, the interference signal PP is forty times harmonics of the reference frequency. Radiation of the harmonics to the receiving circuit 10 from the reference oscillator 21 is a factor for causing suppression in the reception sensitivity.

However, in the first embodiment, the reference oscillator 21 is voltage-controlled by the internal pulse signal Sis outputted from the Pit control circuit 30. Specifically, the oscillation circuit 20 includes a path for transmitting the internal pulse signal Sis from the internal pulse signal output unit 35 to the voltage control terminal Vcx of the reference oscillator 21, and therefore, the reference signal Rs outputted from the reference oscillator 21 is modulated (for example, frequency-modulated) by the internal pulse signal Sis. In this way, the reference frequency which is outputted from the reference oscillator 21 is frequency-modulated by the signal of the comparison frequency as the modulation wave. When the reference frequency is 19.2 MHz and the voltage control range is ±25 ppm as described above, if the entire control range is frequency-modulated, the frequency shift becomes ±480 Hz.

By the frequency modulation, the forty times harmonics radiated from the reference oscillator 21 become a frequency-modulated signal in which the modulation frequency is 200 kHz and the frequency shift is ±19.2 kHz (approximately ±20 kHz) that is forty times of the original frequency shift. That is, as shown in FIG. 3, the forty times harmonics of the single interference signal PP becomes the interference signal PPd that is frequency-modulated by the comparison frequency fr of the internal pulse signal Sis and frequency-diffused to the outside of the frequency bandwidth fd. Note that in FIG. 3, Nf shows a noise floor. Accordingly, in the event that the radio communication device 1 is in a receiving state, when the harmonics of the reference frequency are interference signals to the received signal, the modulation path 24 performs modulation to diffuse and reduce the interference level.

Consequently, the reference oscillator voltage-controlled by the internal pulse signal Sis outputted from the PLL control circuit 30. Thereby, it is possible to reduce the suppression of the receiving sensitivity caused by interference of the harmonics.

The same applies to the case where the comparison frequency fn, which is divided based on the negative feedback signal Ns, as the internal pulse signal Sis of 200 kHz, is inputted to the reference oscillator 21.

By using a fractional frequency division PLL (fractional-N Pit) as the Pit, the internal pulse signal Sis of the comparison frequency that is divided by a fractional accumulator, can be regarded as pseudo-random noise. Therefore, it is possible to more effectively frequency-diffuse the interference signal of the forty times harmonics.

Moreover, according to the first embodiment, because it is possible to reduce the level of the interference signal in the reception band to a level that can be fully ignored, with respect to the realistic received signal strength, a setting in which modulation is not applied in accordance with the reception frequency is not necessary.

The oscillation circuit 20 includes the modulation path 24. However, the modulation path 24 may be provided outside the oscillation circuit 20, and it is sufficient that the radio communication device 1 includes the modulation path 24. The configuration above described is an example; the configuration is not limited as long as a method is adopted in which the reference signal Rs outputted from the reference oscillator 21 is modulated by the signal of the comparison frequency used in the PLL control. Moreover, the modulation may be any modulation to reduce the interference level when the harmonics of the reference frequency are interference signals to the received signal.

Second Embodiment

Figure 4:
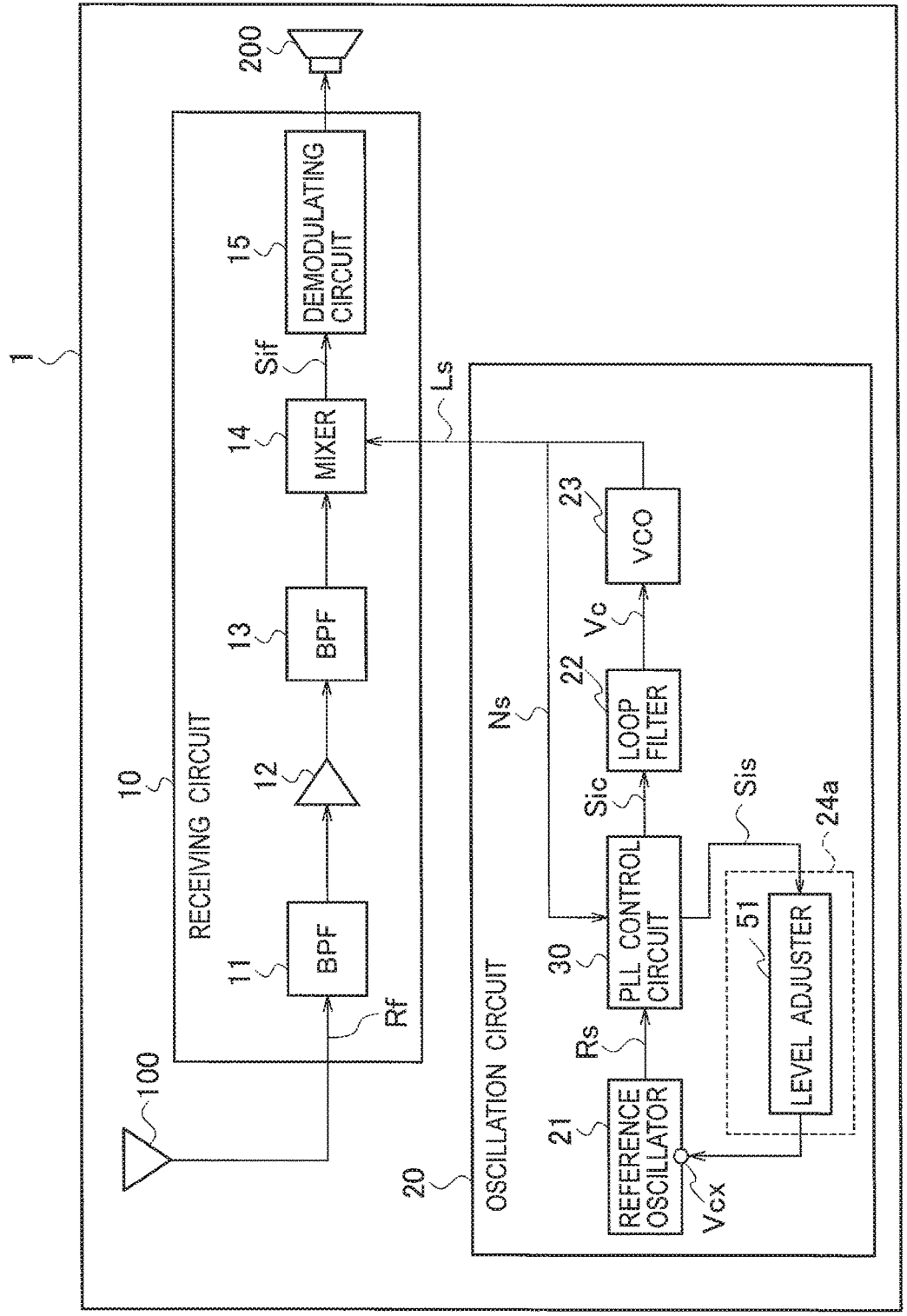
FIG. 4 is a block diagram illustrating a radio communication device according to the second embodiment.

FIG. 4 is a configuration that the oscillation circuit 20 includes a level adjuster 51 to adjust the modulation level or the DC offset properly when the level of the internal pulse signal Sis outputted from the internal pulse signal output unit 35 or the DC offset, is not appropriate for modulating the reference signal Rs outputted from the reference oscillator 21.

In the first embodiment, the reference signal Rs outputted from the reference oscillator 21 is modulated using the entire voltage control range. Because the degree of interfering harmonics varies with the frequency configuration of the radio, the oscillation circuit 20 desirably includes a configuration to adjust the modulation degree properly as shown in the second embodiment.

Moreover, considering that the deviation of the reference oscillator 21 varies in the plus or minus, the level adjuster 51 is desirably provided with a correction function of the DC offset.

According to the first and second embodiments, it is possible to reduce the suppression of the receiving sensitivity caused by interference of the harmonics with a simple circuit configuration.

The present invention is not limited to the first or second embodiment described above, and is changeable in various ways within the scope, without departing from the scope of the present invention.

What is claimed is:

1. A radio communication device comprising:
   an oscillation circuit configured to perform PLL control by using a reference frequency oscillated by a reference oscillator; and
   a modulation path configured to modulate a reference signal outputted from the reference oscillator by a signal of a comparison frequency, as a modulation wave,
   wherein the modulation path modulates the reference signal so as to reduce an interference level, in a case where harmonics of the reference frequency are interference signals to a received signal, when the radio communication device is in a receiving state.

2. The radio communication device according to claim 1, wherein the modulation wave is a divided signal of the reference frequency for phase comparison.

3. The radio communication device according to claim 1, wherein
   the oscillation circuit performs PLL control to control an oscillation frequency oscillated by a voltage-controlled oscillator, and
   the modulation wave is a divided signal of the oscillation frequency for phase comparison.

4. The radio communication device according to claim 1, wherein the modulation path is provided with a level adjuster to adjust a level of the modulation wave.

5. The radio communication device according to claim 4, wherein the level adjuster adjusts a DC offset of the modulation wave.

6. A sensitivity suppression reduction method comprising:
   with a phase-locked loop, performing PLL control by using a reference frequency oscillated by a reference oscillator; and
   modulating a reference signal outputted from the reference oscillator by a signal of a comparison frequency, as a modulation wave,
   wherein the modulating reduces an interference level in a case where harmonics of the reference frequency are interference signals to a received signal.

* * * * *